(12) United States Patent
Siemieniec et al.

(10) Patent No.: US 12,477,800 B2
(45) Date of Patent: Nov. 18, 2025

(54) SEMICONDUCTOR DIODE AND MANUFACTURING METHOD

(71) Applicant: Infineon Technologies AG, Neubiberg (DE)

(72) Inventors: Thomas Ralf Siemieniec, Villach (AT); Joachim Weyers, Höhenkirchen (DE); Armin Tilke, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 430 days.

(21) Appl. No.: 18/125,764

(22) Filed: Mar. 24, 2023

(65) Prior Publication Data

US 2023/0326974 A1 Oct. 12, 2023

(30) Foreign Application Priority Data

Apr. 7, 2022 (DE) .......................... 102022108492.2

(51) Int. Cl.
*H10D 62/832* (2025.01)
*H10D 12/01* (2025.01)
*H10D 30/01* (2025.01)

(52) U.S. Cl.
CPC ....... *H10D 62/8325* (2025.01); *H10D 12/031* (2025.01); *H10D 30/051* (2025.01)

(58) Field of Classification Search
CPC ............ H10D 62/8325; H10D 12/031; H10D 30/051; H10D 8/00; H10D 30/831; H10D 62/822; H10D 62/328; H10D 62/82; H10D 62/8503; H10D 62/115; H10D 84/811; H10D 84/08; H10D 8/01; H10D 62/10

See application file for complete search history.

(56) References Cited

U.S. PATENT DOCUMENTS

| | | |
|---|---|---|
| 2004/0119076 A1 | 6/2004 | Ryu |
| 2017/0018544 A1* | 1/2017 | Voss ........................ H01L 23/62 |
| 2019/0081039 A1 | 3/2019 | Siemieniec et al. |

* cited by examiner

*Primary Examiner* — Mohammad A Rahman
(74) *Attorney, Agent, or Firm* — Murphy, Bilak & Homiller, PLLC (57) ABSTRACT

A semiconductor diode includes a wide bandgap semiconductor body having opposing first and second surfaces. The wide band gap semiconductor body includes a first pn junction diode having a first p-doped region adjoining the first surface and a first n-doped region adjoining both surfaces. The semiconductor diode further includes a semiconductor element including a second pn junction diode having a second p-doped region and second n-doped region, and a dielectric structure between the wide bandgap semiconductor body and semiconductor element. The dielectric structure electrically insulates the wide bandgap semiconductor body from the semiconductor element. The bandgap energy of the semiconductor element is smaller than that of the wide bandgap semiconductor body. A cathode contact is electrically connected to the first n-doped region at the second surface. The second n-doped region of the second pn junction diode is electrically coupled to the first n-doped region of the first pn junction diode.

19 Claims, 3 Drawing Sheets

SEMICONDUCTOR DIODE AND MANUFACTURING METHOD

TECHNICAL FIELD

The present disclosure is related to a semiconductor diode and a manufacturing method, in particular to a semiconductor diode comprising a wide bandgap semiconductor body.

BACKGROUND

Technology development of new generations of wide band gap semiconductor devices, e.g. SiC power semiconductor devices, aims at improving electric device characteristics and reducing costs by shrinking device geometries. Although costs may be reduced by shrinking device geometries, a variety of tradeoffs and challenges have to be met when increasing device functionalities per unit area. For example, wide band gap semiconductor diodes enabling low forward voltages in combination with surge current resistance and avalanche robustness are challenging.

Thus, there is a need for an improved semiconductor diode.

SUMMARY

An example of the present disclosure relates to a semiconductor diode. The semiconductor diode includes a wide bandgap semiconductor body having a first surface and a second surface opposite to the first surface. The wide band gap semiconductor body includes a first pn junction diode having a first p-doped region adjoining the first surface and a first n-doped region adjoining the first surface and the second surface. The semiconductor diode further includes a semiconductor element, the semiconductor element comprising a second pn junction diode having a second p-doped region and a second n-doped region. The semiconductor diode further includes a dielectric structure between the wide bandgap semiconductor body and the semiconductor element, wherein the dielectric structure electrically insulates the wide bandgap semiconductor body from the semiconductor element. The semiconductor diode further includes a cathode contact. The bandgap energy of the semiconductor element is smaller than the bandgap energy of the wide bandgap semiconductor body. The cathode contact is electrically connected to the first n-doped region at the second surface. The second n-doped region of the second pn junction diode is electrically coupled to the first n-doped region of the first pn junction diode.

Another example of the present disclosure relates to a method of producing a semiconductor diode. The method includes forming a first pn junction diode in a wide bandgap semiconductor body. The wide bandgap semiconductor body has a first surface and a second surface opposite to the first surface. The first pn junction diode includes a first p-doped region adjoining the first surface and a first n-doped region adjoining the first surface and the second surface. The method further includes forming a semiconductor element, the semiconductor element comprising a second pn junction diode having a second p-doped region and a second n-doped region. The method further includes forming a dielectric structure between the wide bandgap semiconductor body and the semiconductor element. The dielectric structure electrically insulates the wide bandgap semiconductor body from the semiconductor element. The method further includes forming a cathode contact. The bandgap energy of the semiconductor element is smaller than the bandgap energy of the wide bandgap semiconductor body. The cathode contact is electrically connected to the first n-doped region at the second surface. The second n-doped region of the second pn junction diode is electrically coupled to the first n-doped region of the first pn junction diode.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor diodes and together with the description serve to explain principles of the examples. Further examples are described in the following detailed description and the claims.

DETAILED DESCRIPTION

In the following detailed description, reference is made to the accompanying drawings, which form a part hereof and in which are shown by way of illustrations specific examples of wide band gap semiconductor diodes. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a semiconductor diode may include a wide bandgap semiconductor body having a first surface and a second surface opposite to the first surface. The wide band gap semiconductor body may include a first pn junction diode having a first p-doped region adjoining the first surface and a first n-doped region adjoining the first surface and the second surface. The semiconductor diode may further include a semiconductor element. The semiconductor element may include a second pn junction diode having a second p-doped region and a second n-doped region. The semiconductor diode may further include a dielectric structure between the wide bandgap semiconductor body and the semiconductor element. The dielectric structure may electrically insulate the wide bandgap semiconductor body from the semiconductor element. The semiconductor diode may further include a cathode contact. The bandgap energy of the semiconductor element may be smaller than the bandgap energy of the wide bandgap semiconductor body. The cathode contact may be electrically connected to the first n-doped region at the second surface. The second n-doped region of the second pn junction diode may be electrically coupled to the first n-doped region of the first pn junction diode.

The semiconductor diode may be part of an integrated circuit, or may be a discrete semiconductor device or a semiconductor module, for example. The semiconductor diode may be a vertical semiconductor device having a load current flow between the first surface and the second surface opposite to the first surface. The vertical power semiconductor diode may be configured to conduct currents of more than 1A, or more than 10 A, or more than 30 A, or more than 50A, or more than 75 A, or even more than 100A, and may be further configured to block voltages between load electrodes, e.g. between cathode and anode of the diode, in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the semiconductor diode, for example.

The semiconductor diode may be based on a semiconductor body from a crystalline wide band gap semiconductor material having a band gap larger than the band gap of silicon, i.e. larger than 1.12 eV. The wide band gap semiconductor material may have a hexagonal crystal lattice and may be silicon carbide (SiC) or gallium nitride (GaN), by way of example. For example, the semiconductor material may be 2H—SiC (SiC of the 2H polytype), 6H—SiC or 15R—SiC. According to an example, the semiconductor material is silicon carbide of the 4H polytype (4H—SiC). The semiconductor body may include or consist of a semiconductor substrate having none, one or more than one semiconductor layers, e.g. epitaxially grown layers, thereon.

The first surface may be a front surface or a top surface of the wide bandgap semiconductor body, and the second surface may be a back surface or a rear surface of the wide bandgap semiconductor body, for example. The wide bandgap semiconductor body may be attached to a lead frame via the second surface, for example. Over the first surface of the wide bandgap semiconductor body, bond pads may be arranged and bond wires may be bonded on the bond pads, for example.

The first p-doped region may form a pn junction with the first n-doped region of the first pn junction diode. For example, the first p-doped region may be formed by one or a plurality of p-doped sub-regions. For example, when forming the first p-doped region by a plurality of p-doped sub-regions, the plurality of p-doped sub-regions may each have doping profiles overlapping with each other along a vertical direction, e.g. by forming the plurality of p-doped sub-regions by a plurality of ion implantation processes having different ion implantation energies for setting a penetration depth of the implanted ions into different depths with respect to the first surface.

The first n-doped region may also be formed by a plurality of n-doped sub-regions. For example, the first n-doped region may include a first n-doped sub-region, e.g. an $n^+$-doped cathode contact region, adjoining the cathode contact at the second surface. The $n^+$-doped cathode contact region may have a doping concentration that is large enough to form an ohmic contact to the cathode contact at the second surface. The first n-doped region may include an n-doped drift region as a second n-doped sub-region. The first n-doped sub-region may be arranged between the second n-doped sub-region and the second surface. For example, the drift region may adjoin a bottom side of the first p-doped region. A doping concentration of the drift region may gradually or in steps increase or decrease with increasing distance to the first surface at least in portions of its vertical extension. According to other examples, the impurity concentration in the drift region may be approximately uniform. For wide band gap semiconductor diodes based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extent of the drift region may depend on voltage blocking requirements, e.g. a specified voltage class, of the semiconductor diode. When operating the wide band gap semiconductor device in voltage blocking mode, a space charge region may vertically extend partly or totally through the drift region depending on the blocking voltage applied to the semiconductor diode. The first n-doped region may include an n-doped channel region as a third n-doped sub-region. The second n-doped sub-region may be arranged between the third n-doped sub-region and the first n-doped sub-region. The n-doped channel region may be laterally confined by neighboring first p-doped regions. The channel region may be a channel region of a junction field effect transistor having the first p-doped region acting as a gate of the JFET. Similar to the first p-doped region, the n-doped channel region may be formed by one or a plurality of n-doped sub-regions. For example, when forming the channel region by a plurality of n-doped sub-regions, the plurality of n-doped sub-regions may have doping profiles overlapping with each other along a vertical direction, e.g. by forming the plurality of n-doped sub-regions by a plurality of ion implantation processes having different ion implantation energies for setting a penetration depth of the implanted ions into different depths with respect to the first surface. The first n-doped region may further include an $n^+$-doped channel contact region as a fourth n-doped sub-region. The $n^+$-doped channel contact region may be arranged between the first surface and the n-doped channel region and may adjoin a contact on the first surface. A doping concentration of the n+-doped channel contact region may be large enough to form an ohmic contact to the contact, e.g. a contact plug, on the first surface for electrically connecting the channel region and the second n-doped region of the second pn junction diode, for example.

The semiconductor diode may include an anode contact over the first surface. The anode contact may be electrically connected to the first p-doped region of the first pn junction diode, and to the second p-doped region of the second pn junction diode, for example.

The anode contact, the dielectric structure, and the contact on the channel region may be elements of a wiring area over the wide bandgap semiconductor body. The wiring area may include one or more than one, e.g. two, three, four or even more wiring levels. Each wiring level may be formed by a single one or a stack of conductive layers, e.g. metal layer(s) and/or highly doped semiconductor layer(s). The wiring levels may be lithographically patterned, for example. Between stacked wiring levels, an interlayer dielectric structure may be arranged. Contact plug(s) or contact line(s) may be formed in openings of the interlayer dielectric structure to electrically connect parts, e.g. metal lines or contact areas, of different wiring levels to one another.

For realizing a desired current carrying capacity, the wide band gap semiconductor diode may be designed by a plurality of parallel-connected wide band gap semiconductor diode cells. The parallel-connected wide band gap semiconductor diode cells may, for example, be wide band gap semiconductor diode cells formed in the shape of a strip or a strip segment. Of course, the wide band gap semiconductor device cells can also have any other shape, e.g. circular, elliptical, polygonal such as octahedral. The wide band gap semiconductor diode cells may be arranged in an active area of the wide bandgap semiconductor body. The active area may be an area where the first p-doped region at the first surface and the n+-doped cathode contact region at the second surface are arranged opposite to one another along the vertical direction. In the active area, a load current may enter or exit the wide bandgap semiconductor body. The semiconductor diode may further include an edge termination area that may include a termination structure. In a blocking mode or in a reverse biased mode of the semiconductor diode, the blocking voltage between the active area and a field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof, for example.

By combining the first pn junction diode and the second pn junction diode in the semiconductor diode as described above and below, benefits of semiconductor materials having different bandgap energy may be achieved. For example, the forward voltage of the semiconductor diode may be determined by the forward voltage of the second pn junction diode that has a smaller bandgap energy than the first pn junction diode. The reverse blocking capability of the semiconductor diode may be determined by the voltage blocking capability, e.g. breakdown voltage, of the first pn junction diode that has a larger bandgap energy than the second pn junction diode. This may allow for a low forward voltage while taking benefit of the voltage blocking capability of the semiconductor material having the larger bandgap energy.

Thus, a semiconductor diode having a low forward voltage in combination with surge current resistance and avalanche robustness may be provided.

For example, the semiconductor body may be a SiC semiconductor body and the semiconductor element may comprise or consist of polycrystalline silicon. The polycrystalline silicon may be part of a wiring area over the first surface of the wide bandgap semiconductor body.

For example, the semiconductor diode may further include an anode contact over the first surface. The anode contact may be electrically connected to the second p-doped region. The first p-doped region may be electrically coupled to the anode contact. Contact plugs and/or vias in the wiring area may support electric interconnection, for example.

For example, the first n-doped region may include a channel region adjoining the first surface and the first p-doped region. The first n-doped region may further include a drift region adjoining the channel region and the first p-doped region. An n-type doping concentration may increase by at least a factor of 5 at a transition from the drift region to the channel region.

For example, the n-type doping concentration is constant in the channel region. Depending on the manufacturing method of the channel region, the channel region may also include a plurality of overlapping doping peak profiles, the doping peak profiles overlapping with each other along a vertical direction. For example, carrying out a plurality of ion implantation processes having different ion implantation energies may allow for setting a penetration depth of the implanted ions into different depths with respect to the first surface.

For example, the transition from the drift region to the channel region has a first vertical distance to the first surface. A bottom side of the first p-doped region has a second vertical distance to the first surface. The first vertical distance may range from 60% to 90% of the second vertical distance, for example.

For example, the dielectric structure may be arranged over the first surface. The dielectric structure may be a lowermost insulating layer of a wiring area over the first surface, for example. In addition or as an alternative, the dielectric structure may also line sidewalls and a bottom side of a trench extending into the wide bandgap semiconductor body from the first surface, for example.

For example, the semiconductor diode may further include a first contact extending through the dielectric structure. The first contact may be configured to electrically couple the second n-doped region of the second pn junction diode to the first n-doped region of the first pn junction diode. The first contact may be a contact plug of a wiring area over the first surface of the wide bandgap semiconductor body, for example.

For example, the semiconductor diode may have a bottom surface coverage of the dielectric structure by the first pn junction diode and a top surface coverage of the dielectric structure by the second pn junction diode. The bottom surface coverage of the dielectric structure by the first n-doped region may be smaller than the top surface coverage of the dielectric structure by the second n-doped region. The bottom surface coverage of the dielectric structure may be determined by the part of the first n-doped region that defines the channel region of the JFET, for example.

For example, the at least one diode cell may have a top surface coverage of the dielectric structure by the second p-doped region that may be larger than a top surface coverage of the dielectric structure by the second n-doped region.

For example, the at least one diode cell may have a bottom surface coverage of the dielectric structure by the first p-doped region that is larger than a bottom surface coverage of the dielectric structure by the first n-doped region.

For example, the plurality of diode cells may include a plurality of strip-shaped first pn junction diodes in the wide bandgap semiconductor body extending parallel to each other along a first lateral direction, and a plurality of strip-shaped second pn junction diodes in the semiconductor element extending parallel to each other along the first lateral direction. In the dielectric structure between the first pn junction diode and the second pn junction diode, a plurality of contact openings may be provided for electrically connecting the second p-doped region of the second pn junction diode.

For example, the plurality of diode cells may include a plurality of strip-shaped first pn junction diodes in the wide bandgap semiconductor body extending parallel to each other along a first lateral direction, and a plurality of strip-shaped second pn junction diodes in the semiconductor element extending parallel to each other along a second lateral direction. The second lateral direction may differ from the first lateral direction.

For example, the semiconductor diode may be a discrete semiconductor device in the wide bandgap semiconductor body.

The examples and features described above and below may be combined.

Functional and structural details (e.g. materials, dimensions) described with respect to the examples above shall likewise apply to the examples illustrated in the figures and described with reference to manufacturing methods further below.

An example of a method of producing a semiconductor diode may include forming a first pn junction diode in a wide bandgap semiconductor body. The wide bandgap semiconductor body has a first surface and a second surface opposite to the first surface. The first pn junction diode may include a first p-doped region adjoining the first surface, and a first n-doped region adjoining the first surface and the second surface. The method may further include forming a semiconductor element. The semiconductor element may include a second pn junction diode having a second p-doped region and a second n-doped region. The method may further include forming a dielectric structure between the wide bandgap semiconductor body and the semiconductor element. The dielectric structure may electrically insulate the wide bandgap semiconductor body from the semiconductor element. The method may further include forming a cathode contact. The bandgap energy of the semiconductor element may be smaller than the bandgap energy of the wide bandgap semiconductor body. The cathode contact may be electrically connected to the first n-doped region at the second surface. The second n-doped region of the second pn junction diode may be electrically coupled to the first n-doped region of the first pn junction diode.

For example, forming the second pn junction diode may include forming the semiconductor element over the dielectric structure, the semiconductor element being a polycrystalline silicon layer. Forming the second pn junction diode may further include introducing n- or p-type dopants into the semiconductor element by at least one unmasked or masked ion implantation process or by in-situ doping during a deposition process. Forming the second pn junction diode may further include introducing p- or n-type dopants into the semiconductor element by at least one masked ion implantation process.

For example, forming the first pn junction diode may include introducing n-type dopants into the semiconductor element by a plurality of ion implantation processes having different ion implantation energies.

For example, the plurality of ion implantation processes having different ion implantation energies may be unmasked or masked ion implantation processes.

For example, forming the first pn junction diode may include introducing p-type dopants into the semiconductor element by a plurality of ion implantation processes having different ion implantation energies.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.12 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing a wide band gap semiconductor wafer may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps, or functions disclosed in the specification or claims may not be construed as to be within the specific order, unless explicitly or implicitly stated otherwise, e.g. by expressions like "thereafter", for instance for technical reasons. For example, the dielectric structure may be formed before forming the second pn junction diode. Therefore, the disclosure of multiple acts or functions will not limit these to a particular order unless such acts or functions are not interchangeable for technical reasons. Furthermore, in some examples a single act, function, process, operation, or step may include or may be broken into multiple sub-acts, -functions, -processes, -operations or -steps, respectively. Such sub acts may be included and part of the disclosure of this single act unless explicitly excluded.

Figure 1:
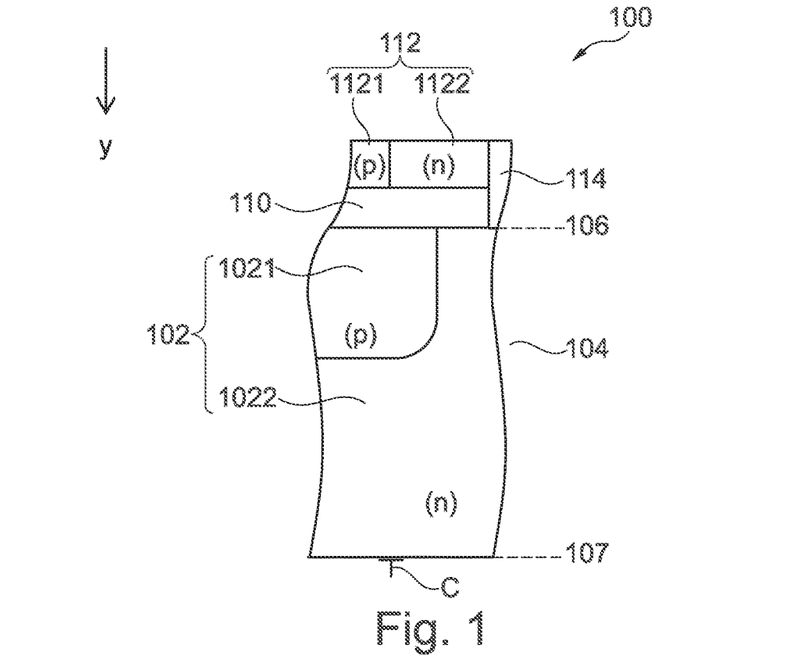
FIGS. 1 and 2 are partial cross-sectional views for illustrating examples of a semiconductor diode including a wide bandgap semiconductor body.

FIG. 1 schematically and exemplarily shows a partial cross-sectional view of a semiconductor diode 100.

The semiconductor diode 100 includes a wide bandgap semiconductor body 104, e.g. a SiC semiconductor body, having a first surface 106 and a second surface 107 opposite to the first surface 106. A first pn junction diode 102 is formed in the wide band gap semiconductor body 104. The first pn junction diode 102 includes a first p-doped region 1021 adjoining the first surface 106 and a first n-doped region 1022 adjoining the first surface 106 and the second surface 107. The semiconductor diode 100 further includes a semiconductor element, the semiconductor element comprising a second pn junction diode 112 having a second p-doped region 1121 and a second n-doped region 1122. The semiconductor diode 100 further includes a dielectric structure 110 between the wide bandgap semiconductor body 104 and the semiconductor element. The dielectric structure 110 electrically insulates the wide bandgap semiconductor body 104 from the semiconductor element. In the example illustrated in FIG. 1, the semiconductor element is arranged over the wide bandgap semiconductor body 104. In other examples, the semiconductor element may also be arranged in a trench extending into the wide bandgap semiconductor body 104, for example. The semiconductor diode 100 further includes a cathode contact C, e.g. a metal layer or a metal layer stack, on the second surface 107, e.g. rear side, of the wide bandgap semiconductor body 104. The bandgap energy of the semiconductor element, e.g. consisting of or comprising polycrystalline Si, is smaller than the bandgap energy of the wide bandgap semiconductor body 104, e.g. consisting of or comprising SiC. The cathode contact C is electrically connected to the first n-doped region 1022 at the second surface 107. The second n-doped region 1122 of the second pn junction diode 112 is electrically coupled to the first n-doped region 1022 of the first pn junction diode 102 via a contact 114, e.g. a contact plug that extends through an opening in the dielectric structure 110.

Figure 2:
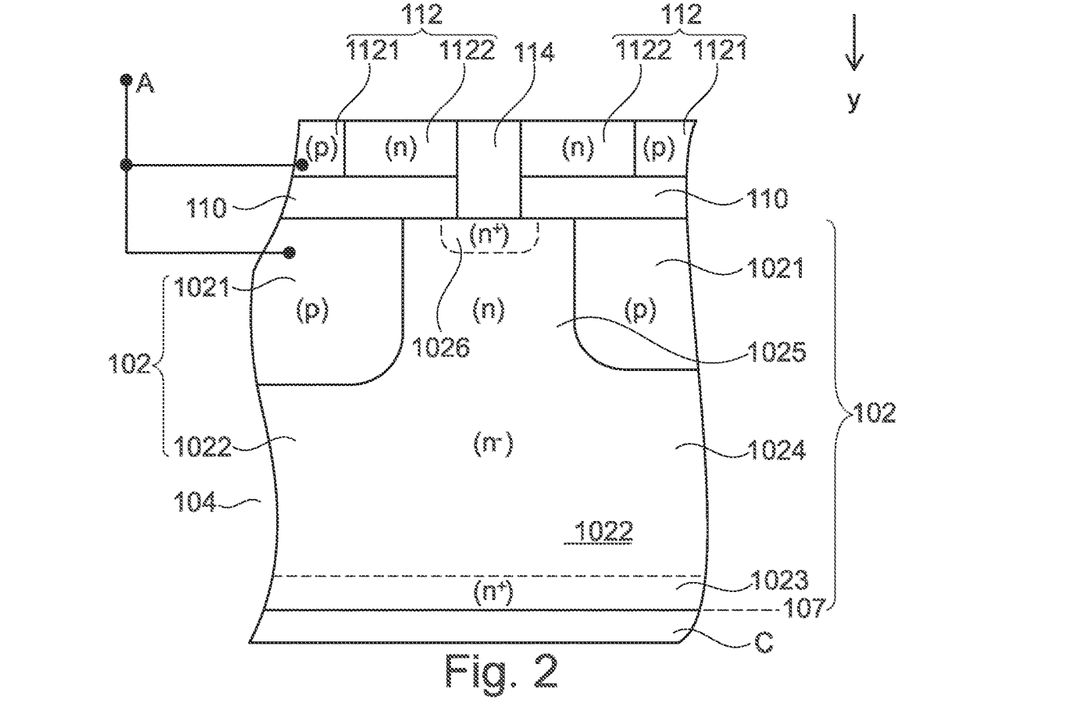

FIG. 2 schematically and exemplarily shows a partial cross-sectional view of a semiconductor diode 100 that is based on FIG. 1 and further illustrates more exemplary details.

The semiconductor diode 100 may be formed by a plurality of diode cells. For example, the diode cells may be formed as parallel strips, e.g. strip-shaped first p-doped regions 1021 extending in parallel along a direction perpendicular to the drawing plane of FIG. 2

The first n-doped region 1022 includes a plurality of n-doped sub-regions that may differ from each other with respect to function and/or doping. For example, the first n-doped region 1022 may include an $n^+$-doped cathode contact region 1023 as first n-doped sub-region. The $n^+$-doped cathode contact region 1023 adjoins the cathode contact C at the second surface 107 and is doped high enough for enabling an ohmic contact to the cathode contact C. The first n-doped region 1022 may further include an $n^-$-doped drift region 1024 as a second n-doped sub-region. A vertical extent and a doping profile of the drift region 1024 may be adapted to voltage blocking requirements, e.g. a specified voltage class, of the semiconductor diode 100. The drift region 1024 may adjoin a bottom side of the first p-doped region 1021. The first n-doped region 1022 may further include an n-doped channel region 1025 as a third n-doped sub-region. The n-doped channel region 1025 is laterally confined by neighboring first p-doped regions 1021. The first n-doped region 1022 may further include an $n^+$-doped channel contact region 1026 as a fourth n-doped sub-region. The $n^+$-doped channel contact region 1026 is doped high enough for enabling an ohmic contact to the contact 114.

Figures 3, 4:
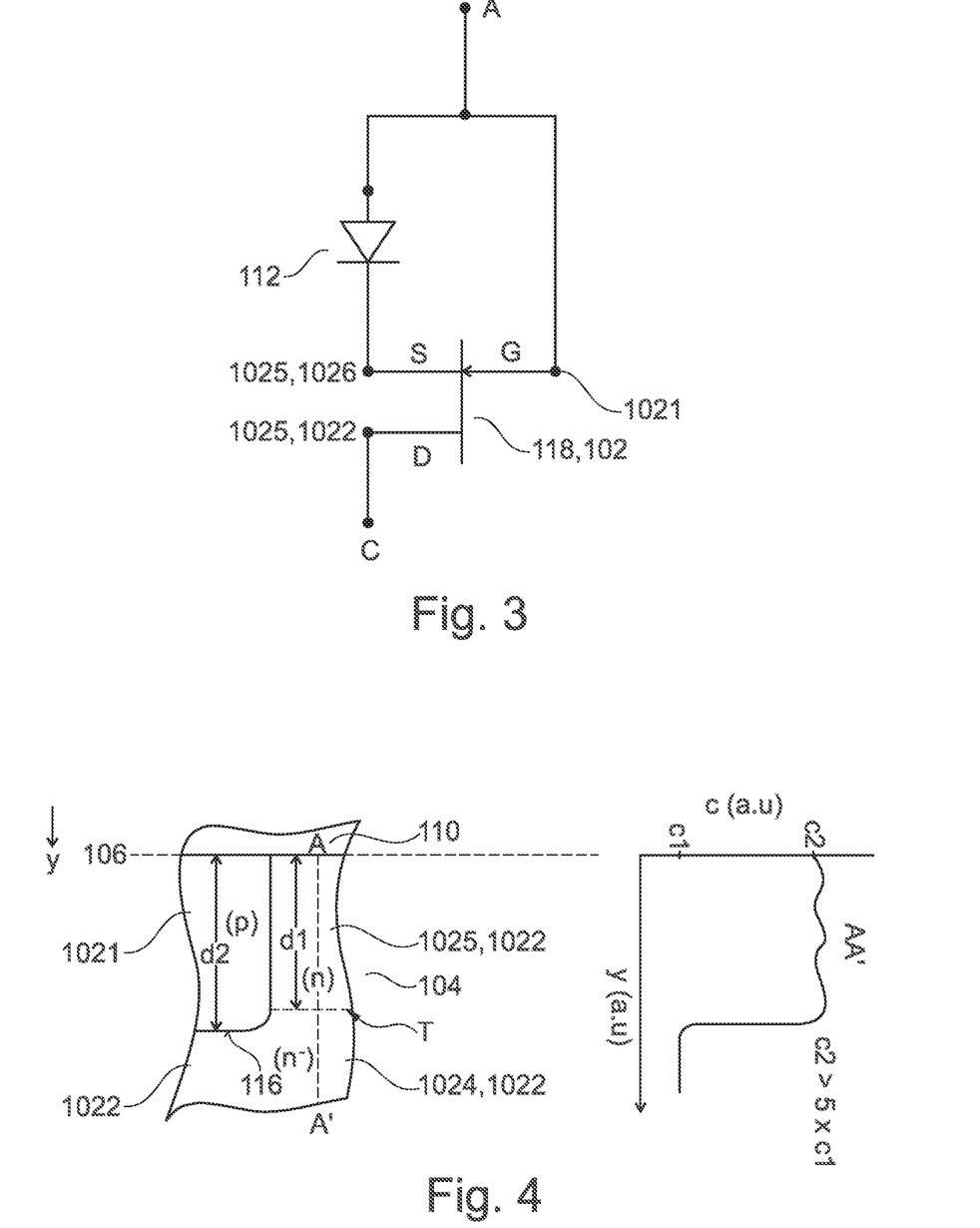
FIG. 3 is an exemplary equivalent circuit diagram of the semiconductor diodes of FIGS. 1 and 2.
FIG. 4 is a partial cross-sectional view for illustrating exemplary details of the semiconductor diode illustrated in FIG. 1.

An exemplary equivalent circuit diagram of the semiconductor diodes 100 of FIGS. 1 and 2 is shown in FIG. 3. For illustration purposes, nodes in the equivalent circuit diagram are linked to elements of the cross-sectional view of FIG. 2 by using the reference signs of the elements in FIG. 2.

The first pn junction diode 102 is part of a JFET 118. A gate G of the JFET corresponds to the first p-doped region 1021 of the first pn junction diode 102. A source S of the JFET 118 corresponds to a first end of the channel region 1025 where the n-doped channel region 1025 is electrically connected to the contact 114 by the $n^+$-doped channel contact region 1026. A drain D of the JFET 118 corresponds to a second end of the channel region 1025 where the n-doped channel region 1025 merges with the $n^-$-doped drift region 1024. The flow of electric charge through the JFET 118 is controlled by constricting the current-carrying n-doped channel region 1025. The current also depends on the electric field between source S and drain D. Constriction of the conducting channel is accomplished using the field effect. When the depletion layer spans the width of the conduction channel, pinch-off is achieved and drain-to-source conduction stops.

A cathode of the second pn junction diode 112, i.e. the second n-doped region 1122 is electrically connected to the n-doped the channel region 1025 of the JFET 118 via the n-doped channel contact region 1026 and the contact 114.

In a forward-bias mode of the semiconductor diode 100, the forward voltage of the semiconductor diode 100 corresponds to the forward voltage of the second pn junction diode 112 that has a smaller bandgap energy than the first pn junction diode 102. The channel region 1025 of the JFET 118 is on in the forward-bias mode of the semiconductor diode 100.

In a blocking voltage mode, e.g. a reverse bias mode, of the semiconductor diode 100, the first pn junction diode 102 is reverse biased, and the breakdown voltage between the $n^-$-doped drift region 1024 and the first p-doped region 1021 of the first pn junction diode 102 corresponds to the breakdown voltage of the semiconductor diode 100. The channel region 1025 of the JFET 118 is off in the reverse-bias mode of the semiconductor diode 100 at reverse voltages close to or smaller than the electric breakdown of the semiconductor diode 100.

The schematic partial cross-sectional view of FIG. 4 illustrates an exemplary transition from the drift region 1024 to the channel region 1025. A vertical level of the transition is schematically indicated by a dashed line T. A bottom side of the channel region 1025 has a first vertical distance d1 to the first surface 106, and a bottom side 116 of the first p-doped region 1021 has a second vertical distance d2 to the first surface 106. The first vertical distance d1 may range from 60% to 90% of the second vertical distance d2, for example.

As is exemplary illustrated in the schematic graph illustrating a doping concentration c through the channel region along the vertical direction y of line AA', an n-type doping concentration c increases by at least a factor of 5 at the transition T from the drift sub-region 1024, e.g. from a doping concentration $c_1$, to the channel sub-region 1025, e.g. to a doping concentration $c_2$ ($c_2 > 5 \times c_1$). In some other examples a bottom side of the channel region 1025 may also be located below the bottom side 116 of the first p-doped region 1021, for example.

Figure 5:
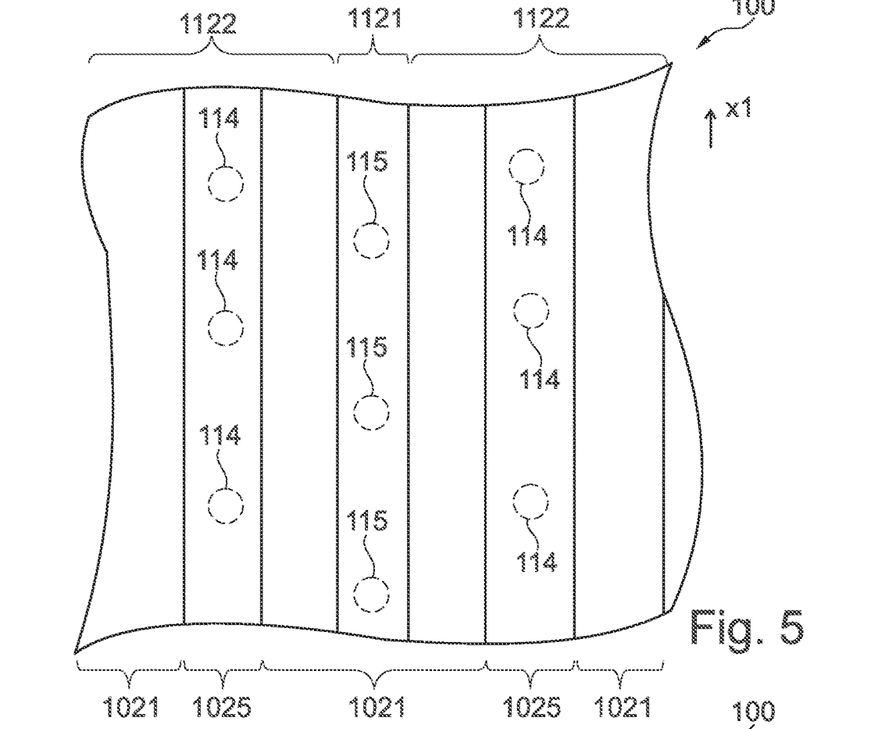
FIGS. 5 and 6 are schematic top views for illustrating examples of semiconductor diodes including strip-shaped first and second pn junction diode cells.
Figure 6:
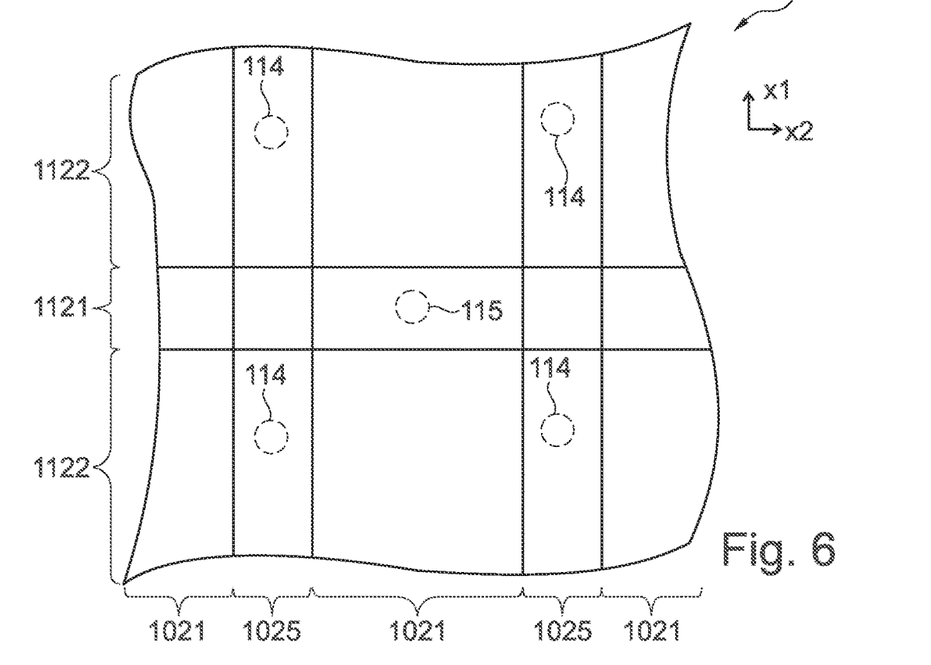

The schematic plan views of FIGS. 5 and 6 illustrate exemplary designs of strip-shaped diode cells of the semiconductor diode 100.

Referring to the schematic plan view of FIG. 5, the semiconductor diode 100 includes a plurality of strip-shaped first pn junction diodes in the wide bandgap semiconductor body extending parallel to each other along a first lateral direction x1. For the strip-shaped first pn junction diodes, strip-shaped channel sub-regions 1025 and strip-shaped first p-doped regions 1021 are illustrated. In the simplified top view of FIG. 5, strip-shaped second pn junction diodes are illustrated in a superposed manner although the strip-shaped second pn junction diodes are arranged over the first pn junction diodes. For the plurality of strip-shaped second pn junction diodes in the semiconductor element, strip-shaped second p-doped regions 1121 and strip-shaped second n-doped regions 1122 are illustrated extending parallel to each other along the first lateral direction x1. The first contacts 114 electrically connect the second n-doped region 1122 to the channel sub-region 1025. Second contacts 115 electrically connect the p-doped second region 1121 to the p-doped first region 1021.

Directions of extension of the strip-shaped first and second pn junction diodes may also differ from each other. One example is illustrated in the schematic top view of FIG. 6. In the example of FIG. 6, strip-shaped second pn junction diodes including the strip-shaped second p-doped regions 1121 and the strip-shaped n-doped regions 1122 extend parallel to each other along a second lateral direction x2 that is perpendicular to the first lateral direction x1.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

The aspects and features mentioned and described together with one or more of the previously detailed examples and figures, may as well be combined with one or more of the other examples in order to replace a like feature of the other example or in order to additionally introduce the feature to the other example.

What is claimed is:

1. A semiconductor diode, comprising:
   a wide bandgap semiconductor body having a first surface and a second surface opposite to the first surface, the wide band gap semiconductor body comprising a first pn junction diode having a first p-doped region adjoining the first surface and a first n-doped region adjoining the first surface and the second surface;
   a semiconductor element comprising a second pn junction diode having a second p-doped region and a second n-doped region;
   a dielectric structure between the wide bandgap semiconductor body and the semiconductor element and electrically insulating the wide bandgap semiconductor body from the semiconductor element; and
   a cathode contact;
   wherein the bandgap energy of the semiconductor element is smaller than the bandgap energy of the wide bandgap semiconductor body,
   wherein the cathode contact is electrically connected to the first n-doped region at the second surface,
   wherein the second n-doped region of the second pn junction diode is electrically coupled to the first n-doped region of the first pn junction diode.

2. The semiconductor diode of claim 1, wherein the semiconductor body is a SiC semiconductor body and the semiconductor element comprises polycrystalline silicon.

3. The semiconductor diode of claim 1, further comprising an anode contact over the first surface, wherein the anode contact is electrically connected to the second p-doped region, and wherein the first p-doped region is electrically coupled to the anode contact.

4. The semiconductor diode of claim 1, wherein the first n-doped region includes a channel region adjoining the first surface and the first p-doped region, and a drift region adjoining the channel region and the first p-doped region, wherein an n-type doping concentration increases by at least a factor of 5 at a transition from the drift region to the channel region.

5. The semiconductor diode of claim 4, wherein the n-type doping concentration is constant in the drift region.

6. The semiconductor diode of claim 4, wherein the transition from the drift region to the channel region has a first vertical distance to the first surface, wherein a bottom side of the first p-doped region has a second vertical distance to the first surface, and wherein the first vertical distance ranges from 60% to 90% of the second vertical distance.

7. The semiconductor diode of claim 1, wherein the dielectric structure is arranged over the first surface.

8. The semiconductor diode of claim 7, further comprising a first contact extending through the dielectric structure, wherein the first contact is configured to electrically couple the second n-doped region of the second pn junction diode to the first n-doped region of the first pn junction diode.

9. The semiconductor diode of claim 7, wherein the semiconductor diode includes a plurality of diode cells, wherein at least one diode cell of the plurality of diode cells has a bottom surface coverage of the dielectric structure by the first pn junction diode and a top surface coverage of the dielectric structure by the second pn junction diode, and wherein the bottom surface coverage of the dielectric structure by the first n-doped region is smaller than the top surface coverage of the dielectric structure by the second n-doped region.

10. The semiconductor diode of claim 9, wherein the at least one diode cell has a top surface coverage of the dielectric structure by the second p-doped region that is larger than a top surface coverage of the dielectric structure by the second n-doped region.

11. The semiconductor diode of claim 9, wherein the at least one diode cell has a bottom surface coverage of the dielectric structure by the first p-doped region that is larger than a bottom surface coverage of the dielectric structure by the first n-doped region.

12. The semiconductor diode of claim 9, wherein the plurality of diode cells includes a plurality of strip-shaped first pn junction diodes in the wide bandgap semiconductor body extending parallel to each other along a first lateral direction, and a plurality of strip-shaped second pn junction diodes in the semiconductor element extending parallel to each other along the first lateral direction.

13. The semiconductor diode of claim 9, wherein the plurality of diode cells includes a plurality of strip-shaped first pn junction diodes in the wide bandgap semiconductor body extending parallel to each other along a first lateral direction, and a plurality of strip-shaped second pn junction diodes in the semiconductor element extending parallel to each other along a second lateral direction, and wherein the second lateral direction differs from the first lateral direction.

14. The semiconductor diode of claim 1, wherein the semiconductor diode is a discrete semiconductor device in the wide bandgap semiconductor body.

15. A method of producing a semiconductor diode, the method comprising:
   forming a first pn junction diode in a wide bandgap semiconductor body, the wide bandgap semiconductor body having a first surface and a second surface opposite to the first surface, the first pn junction diode including a first p-doped region adjoining the first surface and a first n-doped region adjoining the first surface and the second surface;
   forming a semiconductor element, the semiconductor element comprising a second pn junction diode having a second p-doped region and a second n-doped region;
   forming a dielectric structure between the wide bandgap semiconductor body and the semiconductor element, wherein the dielectric structure electrically insulates the wide bandgap semiconductor body from the semiconductor element; and forming a cathode contact, wherein the bandgap energy of the semiconductor element is smaller than the bandgap energy of the wide bandgap semiconductor body, the cathode contact is electrically connected to the first n-doped region at the second surface, and the second n-doped region of the second pn junction diode is electrically coupled to the first n-doped region of the first pn junction diode.

16. The method of the claim 15, wherein forming the second pn junction diode comprises:

forming the semiconductor element over the dielectric structure, the semiconductor element being a polycrystalline silicon layer;

introducing n- or p-type dopants into the semiconductor element by at least one unmasked or masked ion implantation process or by in-situ doping during a deposition process; and introducing p- or n-type dopants into the semiconductor element by at least one masked ion implantation process.

17. The method of claim 16, wherein forming the first pn junction diode comprises:

introducing n-type dopants into the semiconductor element by a plurality of ion implantation processes having different ion implantation energies.

18. The method of claim 17, wherein the plurality of ion implantation processes having different ion implantation energies are unmasked ion implantation processes.

19. The method of claim 15, wherein forming the first pn junction diode comprises:

introducing p-type dopants into the semiconductor element by a plurality of ion implantation processes having different ion implantation energies.

* * * * *